(12) United States Patent
Furuta

(10) Patent No.: US 10,901,277 B2
(45) Date of Patent: Jan. 26, 2021

(54) DISPLAY DEVICE, DISPLAY SYSTEM, AND METHOD OF INSTALLING ELECTRONIC COMPONENT

(71) Applicant: LG Display Co., Ltd., Seoul (KR)

(72) Inventor: Kaoru Furuta, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 174 days.

(21) Appl. No.: 16/358,164

(22) Filed: Mar. 19, 2019

(65) Prior Publication Data

US 2019/0212604 A1   Jul. 11, 2019

Related U.S. Application Data

(62) Division of application No. 15/717,769, filed on Sep. 27, 2017, now Pat. No. 10,281,780.

(30) Foreign Application Priority Data

Sep. 28, 2016 (JP) .................................. 2016-189588

(51) Int. Cl.
*B23K 1/00* (2006.01)
*G02F 1/1345* (2006.01)
(Continued)

(52) U.S. Cl.
CPC ........ *G02F 1/13452* (2013.01); *B23K 1/0008* (2013.01); *B23K 1/0016* (2013.01);
(Continued)

(58) Field of Classification Search
CPC . G02F 1/13452; G02F 1/13336; H05K 1/189; H05K 3/3463; H05K 2201/10128;
(Continued)

(56) References Cited

U.S. PATENT DOCUMENTS 6,542,213 B1   4/2003   Uchiyama
7,483,109 B2   1/2009   Ishibashi
(Continued)

FOREIGN PATENT DOCUMENTS

JP   S6229083 A    2/1987
JP   H10-123557 A   5/1998
(Continued)

*Primary Examiner* — Kiley S Stoner
(74) *Attorney, Agent, or Firm* — Seed IP Law Group LLP

(57) ABSTRACT

A display device includes a substrate stack including two substrates, a line between the two substrates, and a substrate side line connection part at an end of the line. The display device also includes an electronic component having an electronic component side line connection part. The electronic component side line connection part faces a vertical end surface of the substrate stack. The display device further includes a junction part that electrically joins the vertical end surface and the electronic component. The junction part includes a solder junction part between the substrate side line connection part and the electronic component side line connection part, a resin adhesion part at a region outside the solder junction part that adheres the vertical end surface and the electronic component, and a low-melting junction part between the vertical end surface and the electronic component and formed of a material having a melting point lower than the solder particle.

14 Claims, 10 Drawing Sheets

(51) Int. Cl.
*G02F 1/1333* (2006.01)
*H05K 1/18* (2006.01)
*H05K 3/34* (2006.01)

(52) U.S. Cl.
CPC ......... *G02F 1/13336* (2013.01); *H05K 1/189* (2013.01); *H05K 3/3463* (2013.01); *H05K 2201/10128* (2013.01)

(58) Field of Classification Search
CPC ...... H05K 3/1216; H05K 3/3468; G09F 9/00; B23K 1/0016; B23K 1/0008; B23K 2101/36–42
USPC ... 228/179.1–180.22, 175–176, 248.1–248.5
See application file for complete search history.

(56) References Cited

U.S. PATENT DOCUMENTS

| | | | | |
|---|---|---|---|---|
| 2003/0168733 A1* | 9/2003 | Hashimoto | ............ | H01L 24/13 |
| | | | | 257/734 |
| 2005/0121500 A1* | 6/2005 | Schenk | ............ | B23K 35/3613 |
| | | | | 228/248.1 |
| 2009/0197111 A1* | 8/2009 | Saimen | ............ | H05K 3/361 |
| | | | | 428/626 |
| 2010/0188821 A1 | 7/2010 | Yamazaki et al. | | |
| 2012/0262886 A1 | 10/2012 | Yamagishi | | |
| 2013/0082984 A1 | 4/2013 | Drzaic et al. | | |
| 2014/0158751 A1* | 6/2014 | Motomura | ........... | H05K 3/3442 |
| | | | | 228/248.1 |
| 2016/0351532 A1* | 12/2016 | Akutsu | ........... | H05K 3/323 |
| 2017/0005083 A1 | 1/2017 | Choi et al. | | |
| 2017/0357121 A1* | 12/2017 | Cho | ............ | G02F 1/13452 |
| 2018/0088388 A1 | 3/2018 | Furuta | | |
| 2018/0088389 A1 | 3/2018 | Furuta | | |
| 2019/0279547 A1* | 9/2019 | Zhu | ............ | G09F 9/30 |

FOREIGN PATENT DOCUMENTS

| | | |
|---|---|---|
| JP | 2004521501 A | 7/2004 |
| JP | 2004-260131 A | 9/2004 |
| JP | 3769688 B2 | 4/2006 |
| JP | 2007-128982 A | 5/2007 |
| JP | 2010-237405 A | 10/2010 |
| JP | 2010237404 A | 10/2010 |
| JP | 2012-226058 A | 11/2012 |
| WO | 2016043265 A1 | 3/2016 |

* cited by examiner

DISPLAY DEVICE, DISPLAY SYSTEM, AND METHOD OF INSTALLING ELECTRONIC COMPONENT

CROSS-REFERENCE TO RELATED APPLICATION

The present application is a divisional application of U.S. patent application Ser. No. 15/717,769 filed on Sep. 27, 2017, which claims priority from and the benefit under 35 U.S.C. § 119(a) of Japanese Patent Application No. 2016-189588 filed on Sep. 28, 2016, which is hereby incorporated by reference in its entirety.

BACKGROUND

Technical Field

The present disclosure relates to a display device, a display system, and a method of installing or mounting an electronic component.

Description of the Related Art

Generally, the electronic component for the electronic device is installed on a surface of a substrate by joining a pad part of the electronic component to a line pattern on the substrate.

For example, Japanese Patent Publication No. 2012-226058 discloses a connection method of the line pattern of the substrate and a line connection part of the electronic component by using an anisotropic conductive film (ACF). The anisotropic conductive film includes conductive particles dispersed in a thermosetting resin (thermohardening resin or thermally-curable resin). The line pattern of the substrate and the line connection part of the electronic component are electrically connected to each other by the anisotropic conductive film.

When the anisotropic conductive film is used as disclosed in Japanese Patent Publication No. 2012-226058, the conductive particles physically contact with the line pattern of the substrate and the line connection part of the electronic component, and thus the line pattern of the substrate and the line connection part of the electronic component are electrically connected to each other. However, since the conductive particles are dispersed in the thermosetting resin, the connection resistance tends to increase.

In addition, between the substrate and the electronic component, there exists an insulated part other than the junction part between the line pattern of the substrate and the line connection part of the electronic component. Some of the conductive particles dispersed in the thermosetting resin are interposed between the substrate and the electronic component corresponding to the insulated part. This decreases the insulating properties in the insulated part.

Furthermore, recently in display devices, the display image has become finer, and the pitch (interval) of the line pattern of the substrate has narrowed to, for example, 100 µm or less. When the line pattern having the narrow pitch is used, problems such as an increase in the connection resistance and a decrease in the insulating properties due to use of the anisotropic conductive film become more significant.

Accordingly, the electrical connection must be increased, thereby suppressing the connection resistance, while firmly bonding the electronic component to the substrate.

Additionally, in embodiments where the line connection part of the electronic component is connected to the substrate having the narrow pitch line pattern as described above, high positioning accuracy of the line pattern of the substrate and the line connection part of the electronic component is required.

However, when the line pattern of the substrate and the line connection part of the electronic component are bonded to each other, the line pattern of the substrate and the line connection part of the electronic component may be deviated.

As such, there is a continuing need in the art for a method of installing or mounting electronic components that do not have these limitations.

BRIEF SUMMARY

Accordingly, the present disclosure is directed to a display device, a display system, and a method of installing or mounting an electronic component. The disclosed method substantially obviates one or more technological problems due to limitations of the related art.

In at least one embodiment, the present disclosure provides a display device, a display system, and a method of installing or mounting an electronic component that can align an electronic component with high accuracy with respect to a line pattern of a substrate board, firmly bond the electronic component to the end surface of the substrate, and increase the electrical connection, thereby suppressing the connection resistance.

Additional features and embodiments of the present disclosure will be set forth in the description which follows, and will be apparent from the description. The technological improvements of the present disclosure will be realized and attained by the structure particularly pointed out in the written description and claims hereof as well as the appended drawings.

In accordance with the present disclosure, as embodied and broadly described herein, there is provided a method of installing an electronic component that includes disposing the electronic component having an electronic component side line connection part at a vertical end surface of a substrate stack including two substrates, a line between the two substrates, and a substrate side line connection part at an end of the line. The electronic component side line connection part faces the vertical end surface. The method further includes forming an auto-agglutination solder between the electronic component side line connection part and the substrate side line connection part. The auto-agglutination solder includes a thermosetting resin and a solder particle. Additionally, the method includes forming a provisional junction substance between the vertical end surface of the substrate stack and the electronic component, the provisional junction substance formed of a material having a melting point lower than the solder particle. The method also includes provisionally junctioning the electronic component and the vertical end surface of the substrate stack by softening the provisional junction substance at a temperature lower than a melting point of the solder particle and the melting point of the provisional junction substance. The method additionally includes pressurizing the electronic component side line connection part and the substrate side line connection part by heating-up the auto-agglutination solder and the provisional junction substance.

In another embodiment, the present disclosure is directed towards a display device includes a substrate stack including two substrates, a line between the two substrates, and a substrate side line connection part at an end of the line. The display device further includes an electronic component having an electronic component side line connection part. The electronic component side line connection part faces a vertical end surface of the substrate stack. Additionally, the display device includes a junction part that electrically joins the vertical end surface and the electronic component. The junction part includes a solder junction part between the substrate side line connection part and the electronic component side line connection part. The junction part also includes a resin adhesion part at a region outside the solder junction part that adheres the vertical end surface and the electronic component. The junction part further includes a low-melting junction part between the vertical end surface and the electronic component and formed of a material having a melting point lower than the solder particle.

In another embodiment, the present disclosure is directed towards a display system that includes a first display device, a second display device adjacent to the first display device along a first direction, and a third display device adjacent to the first display device along a second direction. At least one of the first, second, and third display devices includes: a substrate stack having two substrates, a line between the two substrates, and a substrate side line connection part at an end of the line; an electronic component having an electronic component side line connection part, the electronic component side line connection part facing a vertical end surface of the substrate stack; and a junction part that electrically joins the vertical end surface and the electronic component. The junction part includes a solder junction part between the substrate side line connection part and the electronic component side line connection part. The junction part also includes a resin adhesion part at a region outside the solder junction part that adheres the vertical end surface and the electronic component. The junction part further includes a low-melting junction part between the vertical end surface and the electronic component and formed of a material having a melting point lower than the solder particle.

The foregoing general description and the following detailed description are by example and explanatory and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION

Reference will now be made in detail to embodiments of the disclosure, examples of which are illustrated in the accompanying drawings.

First Embodiment

Figure 1:
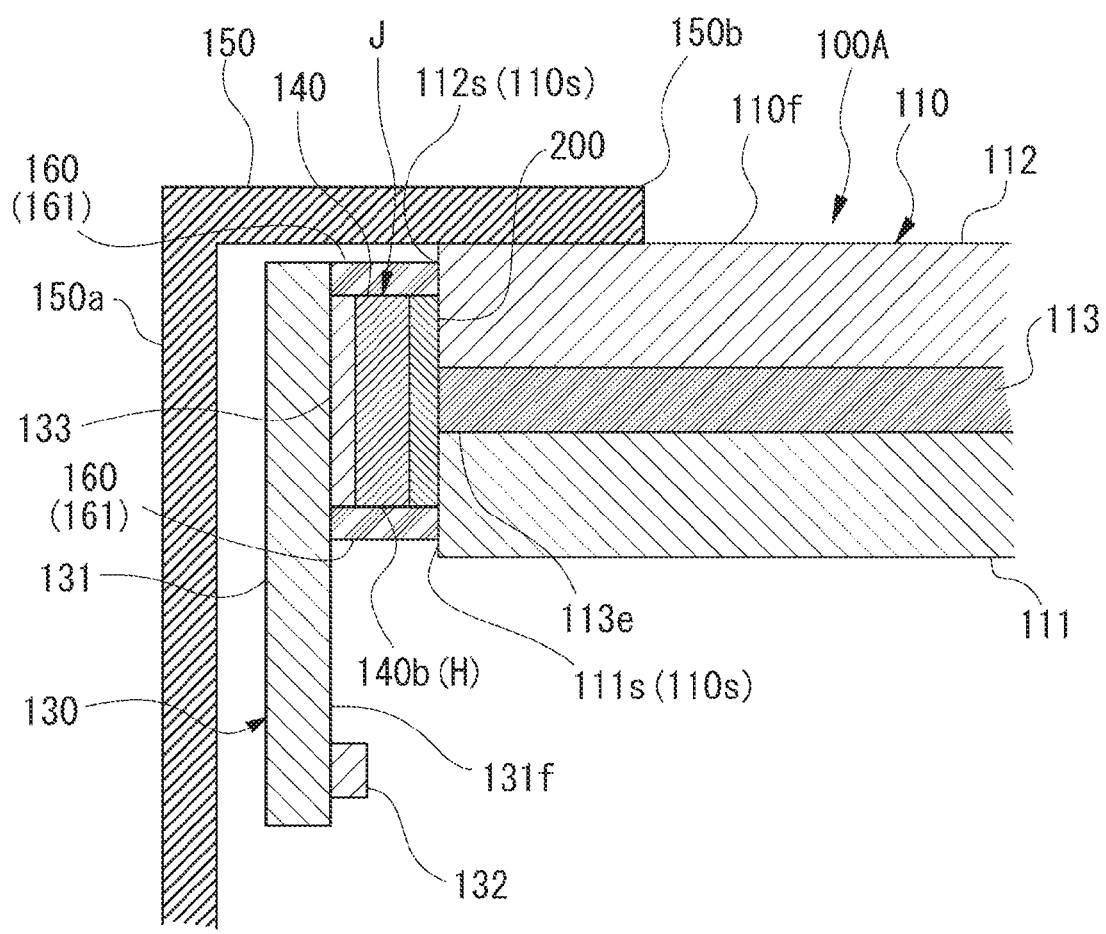
FIG. 1 is a schematic cross-sectional view of a portion of a display device according to a first embodiment of the present disclosure.
Figure 2:
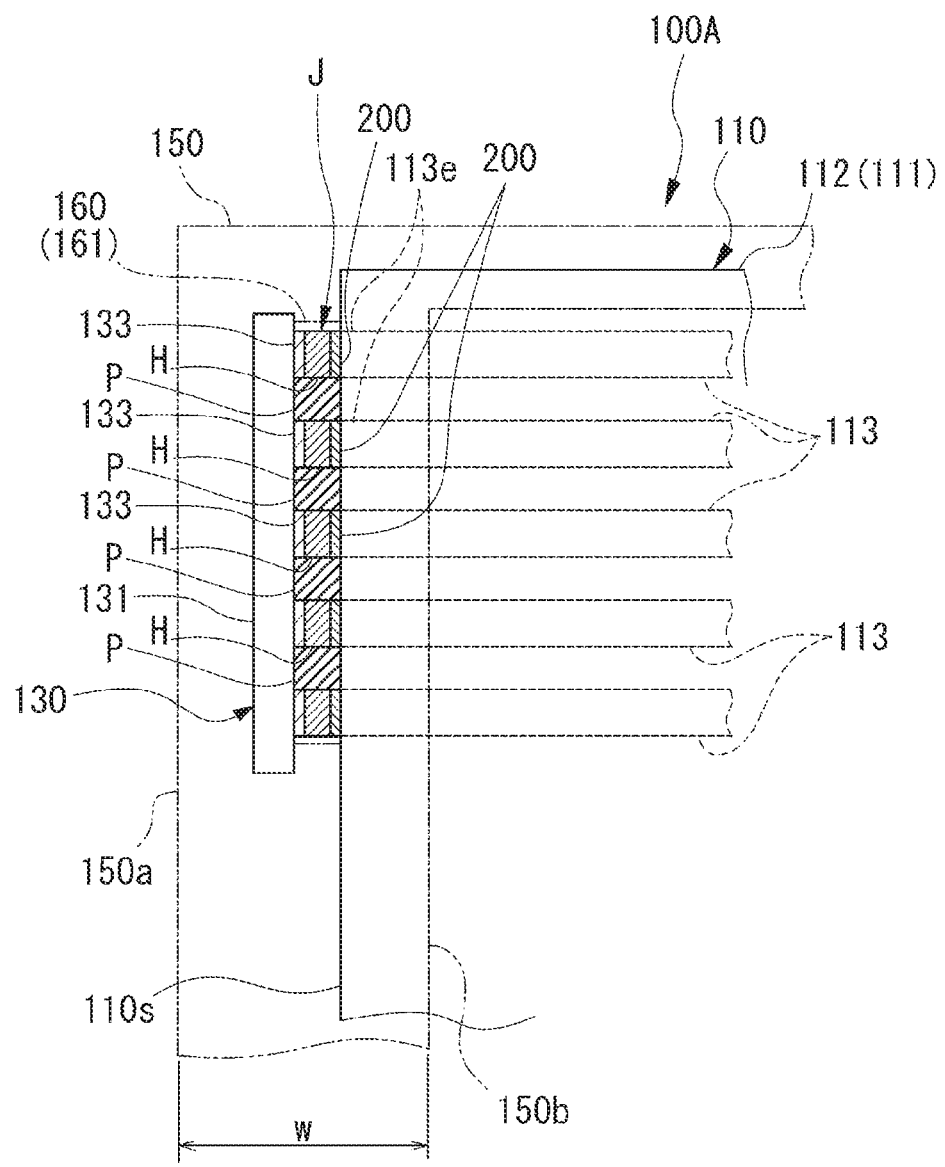
FIG. 2 is a schematic plane view of a portion of the display device.
Figure 3:
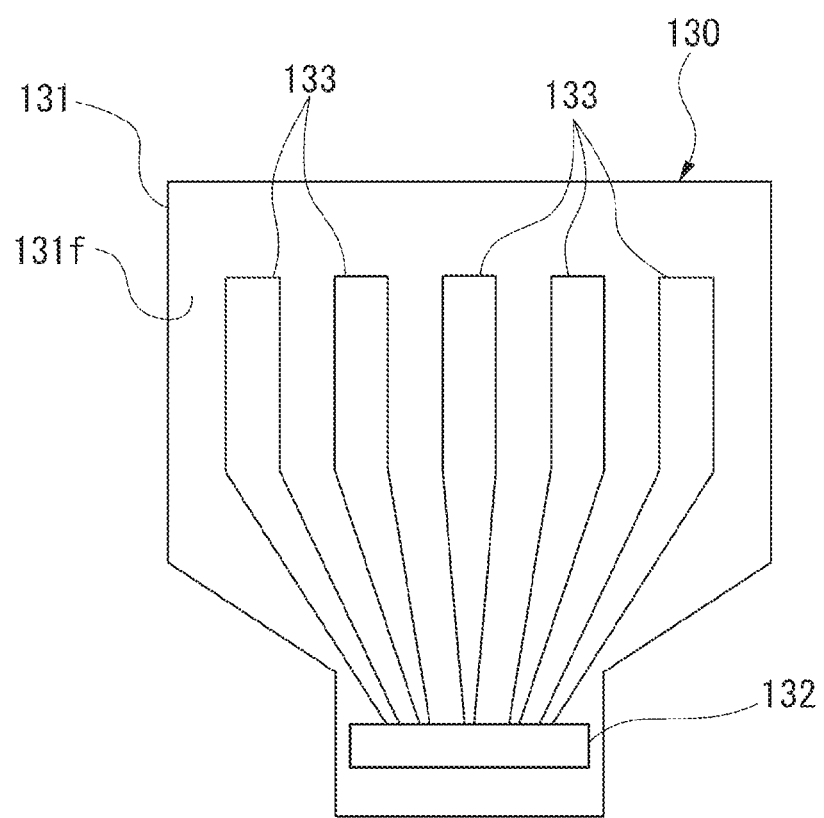
FIG. 3 is a view showing an electronic component for the display device.
Figure 4:
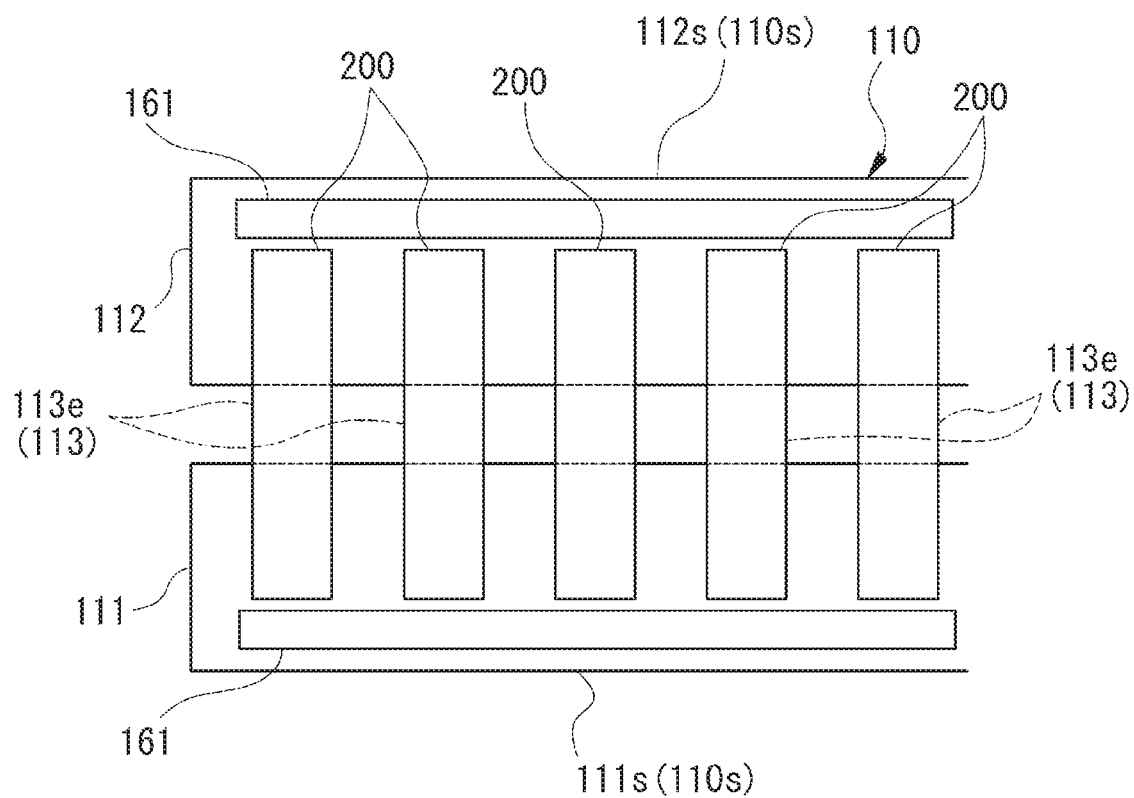
FIG. 4 is a side view of the display device including a junction pad at a vertical side.
Figure 5:
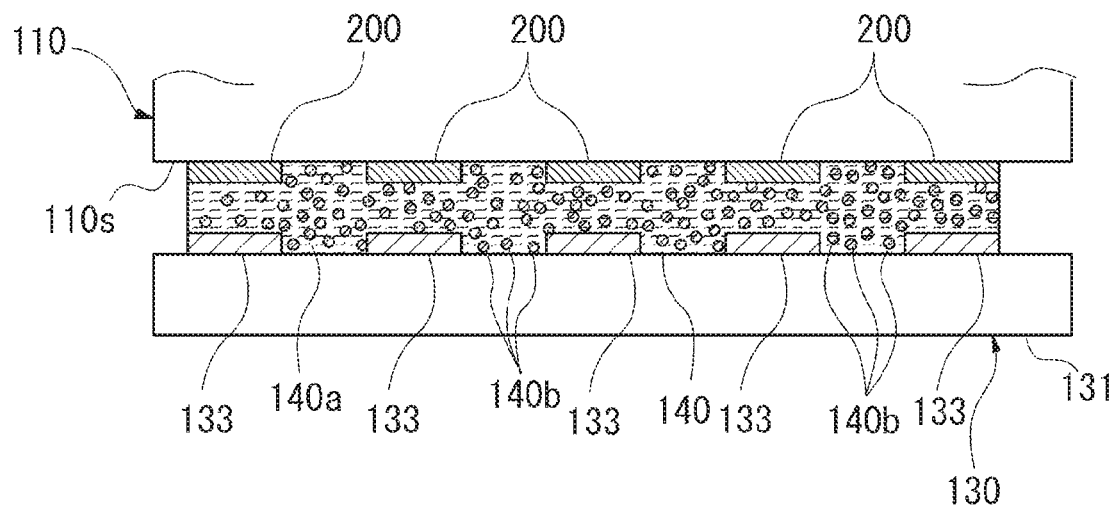
FIG. 5 is a view illustrating a step of coating an auto-agglutination solder.
Figure 6:
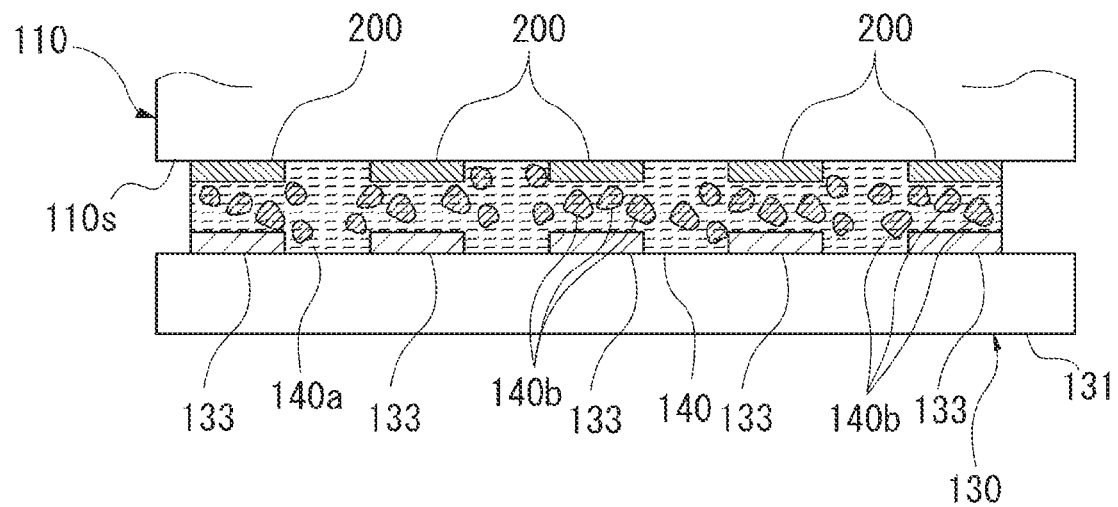
FIG. 6 is a view illustrating a step of starting agglutination of the auto-agglutination solder particles.
Figure 7:
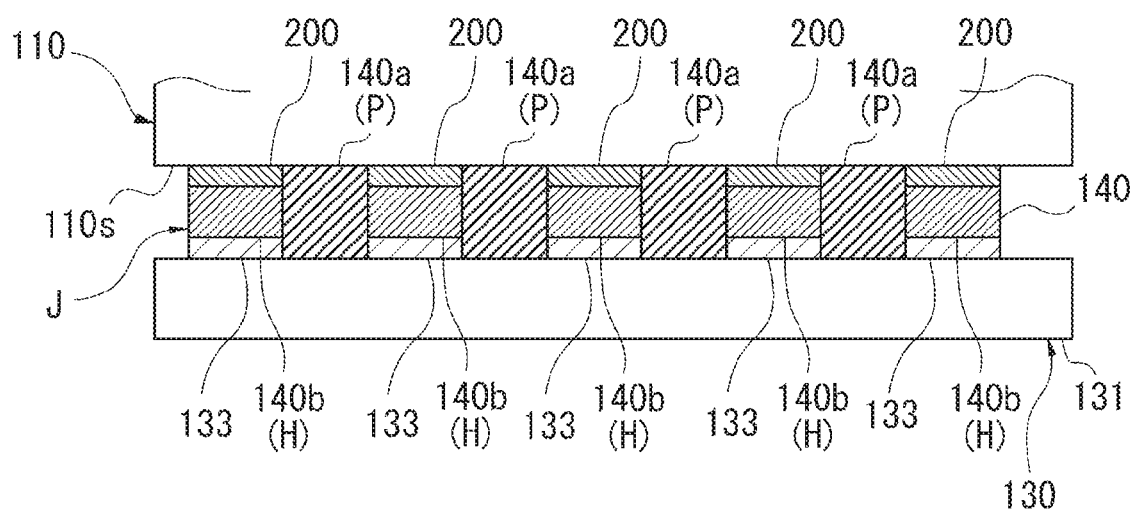
FIG. 7 is a view illustrating the junction of the electronic component to the vertical end surface of the display device by auto-agglutination of the auto-agglutination solder particles.
Figure 8:
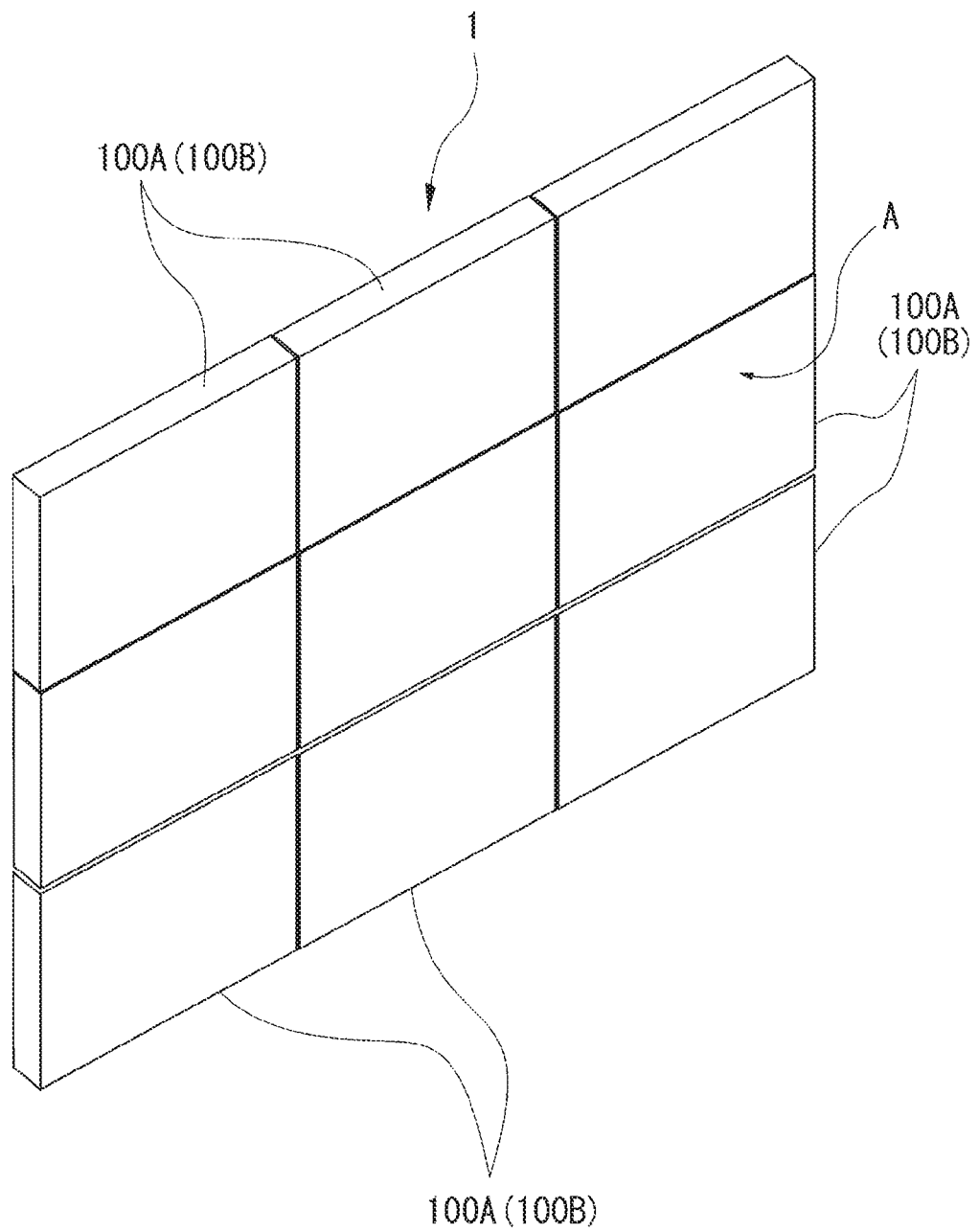
FIG. 8 is a perspective view of a display system including the display device.
Figure 9:
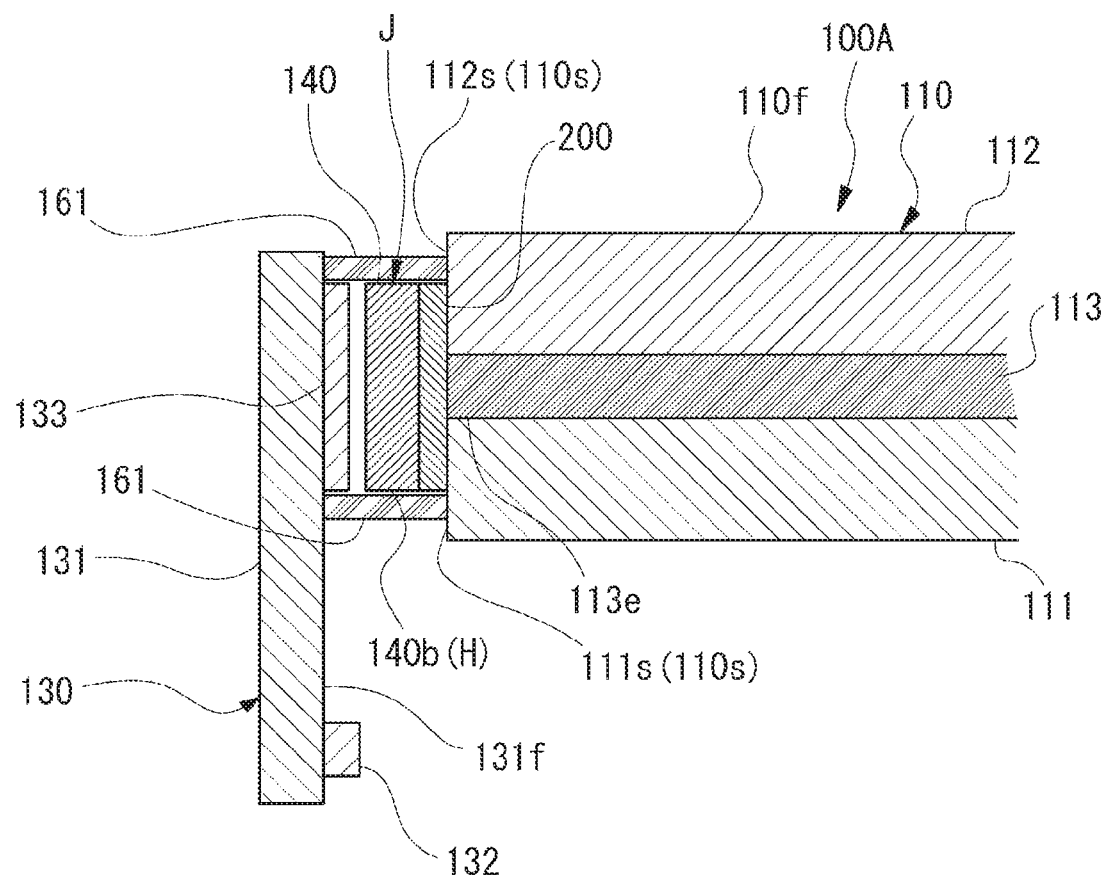
FIG. 9 is a view illustrating the provisional junction of the electronic component to the vertical end surface of the display device by the provisional junction sub stance.

FIG. 1 is a schematic cross-sectional view of a portion of a display device according to a first embodiment of the present disclosure. FIG. 2 is a schematic plane view of a portion of the display device. FIG. 3 is a view showing an electronic component for the display device. FIG. 4 is a side view of the display device including a junction pad at a vertical side. FIG. 5 is a view illustrating a step of coating an auto-agglutination solder. FIG. 6 is a view illustrating a step of starting agglutination of the auto-agglutination solder particles. FIG. 7 is a view illustrating the junction of the electronic component to the vertical end surface of the display device by auto-agglutination of the auto-agglutination solder particles. FIG. 8 is a perspective view of a display system including the display device. FIG. 9 is a view illustrating the provisional junction of the electronic component to the vertical end surface of the display device by the provisional junction substance.

Referring to FIGS. 1 and 2, a display device 100A includes a display panel (e.g., a liquid crystal panel) 110, a light source (not shown) that emits light toward the display panel 110, and a light guiding part (not shown) that guides the light from the light source toward a rear side of the display panel 110. The display panel 110 may be referred to as a substrate stack or a substrate device.

The display panel 110 as the liquid crystal panel includes a first substrate (a substrate) 111, a second substrate (a substrate) 112 facing the first substrate 111 and a liquid crystal layer (not shown) between the first and second substrates 111 and 112.

Each of the first and second substrates 111 and 112 may be one of a glass substrate, a resin substrate and a print substrate.

Although not shown in the figures, on at least one of the first and second substrates 111 and 112 (e.g., the first substrate 111), a line part (a line) 113, which includes at least one signal line including a data line and a gate line, a thin film transistor, and so on, are formed. The liquid crystal layer is driven by the line part 113 such that the display panel 110 displays an image. The line part 113 may have a single-layered structure formed of a low resistance conductive material, e.g., aluminum (Al) or copper (Cu). Alternatively, the line part 113 may have a multi-layered structure including a first layer formed of a lower resistance conductive material, e.g., Al or Cu and a second layer formed of a conductive material, e.g., chrome (Cr), molybdenum (Mo) or titanium (Ti).

An end 113e of each line part 113 is a drawout part of the line part 113. The end 113e has a single-layered structure formed of a conductive material that is capable of forming an electrical junction with the solder. The conductive material for the end 113e of the line part 113 may be one of tin (Sn), lead (Pb), zinc (Zn), silver (Ag) and copper (Cu). Alternatively, the end 113e of the line part 113 may have a multi-layered structure including a first layer of the above conductive material and a second layer formed of Cr, Mo or Ti.

In the display panel 110, the end surface 111s of the first substrate 111 and the end surface 112s of the second substrate 112 are disposed on the same plane. At the end of the display panel 110, a vertical end surface 110s, which is perpendicular to a display surface 110f, is formed (or defined) by the end surface 111s of the first substrate 111 and the end surface 112s of the second substrate 112.

In the vertical end surface 110s of the display panel 110, the electronic component 130 is installed. As shown in FIGS. 1 and 3, the electronic component 130 may include a line substrate (a film substrate) 131 as a film type and a chip component 132, e.g., a large scale integration (LSI), installed on a surface 131f of the line substrate 131. For example, the electronic component 130 may be a chip on film (COF). On the surface 131f of the line substrate 131, a plurality of connection electrodes (an electronic component side line connection part) 133, which are respectively junctioned with the line parts 113 of the display panel 110, are formed. The connection electrode 133 may be formed of a conductive material, e.g., Sn, Pb, Zn, Ag or Cu, that is capable of junctioning with the solder.

As shown in FIGS. 1 and 4, to install the electronic component 130, a connection pad (a substrate side line connection part) 200 is junctioned to the end 113e of each line part 113 between the first and second substrates 111 and 112. The connection pad 200, which has a band shape and covers a portion of the first substrate 111 and a portion of the second substrate 112, is formed along the vertical end surface 110s of the display panel 110. The connection pad 200 may be formed of a conductive material, e.g., Sn, Pb, Zn, Ag or Cu, that is capable of junctioning with the solder.

In some embodiments, the connection pad 200 may be formed from a paste or a nano-ink of Ag or Cu by a screen printing process, a mesh-mask printing process or an ink-jet process. For example, the connection pad 200 may have a width of about 10 to 100 µm, a length of about 0.1 to 1 mm and a thickness of about 10 to 1000 nm.

As shown in FIGS. 1 and 2, the electronic component 130 is solder-junctioned to the connection pad 200 at the vertical end surface 110s of the display panel 110 by an auto-agglutination solder 140. As shown in FIG. 5, the auto-agglutination solder 140 is a paste material. In the auto-agglutination solder 140, a solder particle 140b formed of a solder-alloy material, e.g., Cu or Sn, is uniformly dispersed in a thermosetting resin 140a. The thermosetting resin 140a is formed of a material having a melting point lower than the solder particle 140b. As the material for forming the thermosetting resin 140a, for example, an epoxy resin, a urethane resin, an acrylic resin, a silicone resin, a phenol resin, a melamine resin, an alkyd resin, an urea resin, an unsaturated polyester resin, or the like, which has a melting point of 90° C. to 150° C., may be used. Here, the material for forming the thermosetting resin 140a exhibits fluidity at a temperature of the melting point or more.

For example, 'Reflow Self Assembly Anisotropic Conductive Paste Epowell AP series' (SEKISUI CHEMICAL CO., LTD.) or 'Low-Temperature-Curable conductive' (Hitachi Chemical Co., Ltd.) may be used as the auto-agglutination solder 140.

In addition, around the auto-agglutination solder 140 junctioning the vertical end surface 110s of the display panel 110 and the electronic component 130, more particularly, at each of an upper side and a lower side of the auto-agglutination solder 140, a resin junction part (a low melting junction part) 160 is formed of a resin material having a melting point lower than the solder-alloy material for the solder particle 140b contained in the auto-agglutination solder 140. The resin junction part 160 may be formed of, for example, an epoxy resin, a urethane resin, an acrylic resin, a silicone resin, a phenol resin, a melamine resin, an alkyd resin, an urea resin, an unsaturated polyester resin, or the like, which has a melting point of 90° C. to 150° C. Moreover, the resin material for the resin junction part 160 is thermally cured when it is heated again above the melting point in order to create a soldering-junction using the auto-agglutination solder 140 after provisionally junctioning the electronic component 130 to the vertical end surface 110s of the display panel 110. This maintains the junction condition between the electronic component 130 and the vertical end surface 110s of the display panel 110.

The junction of the electronic component 130 to the connection pad 200 at the vertical end surface 110s of the display panel 110 is made using the auto-agglutination solder 140. In some embodiments, the auto-agglutination solder 140 is coated on the vertical end surface 110s of the display panel 110. For example, the auto-agglutination solder 140 may be coated by a screen printing process, a mesh-mask printing process, or an ink-jet process.

In addition, as shown in FIGS. 4 and 9, at the vertical end surface 110s of the display panel 110, a provisional junction substance 161 is coated on each of upper and lower sides of a coating area of the auto-agglutination solder 140. In some embodiments, the provisional junction substance 161 has a thickness larger than a coating thickness of the auto-agglutination solder 140 in a direction facing the vertical end surface 110s of the display panel 110 and the electronic component 130. In this manner, the provisional junction substance 161 provided at the vertical end surface 110s of the display panel 110 surely contacts the electronic component 130 during the provisional junctioning to be described later.

Moreover, since the provisional junction substance 161 spreads upward and downward as compared with a coating area when the auto-agglutination solder 140 is thermally bonded, the provisional junction substance 161, beneficially, is provided on a certain position that provisional junction substance 161 does not interfere with the auto-agglutination solder 140 considering the spread.

Alternatively, the provisional junction substance 161 may be provided on only one of the upper and lower sides of the coating area of the auto-agglutination solder 140. In addition, the provisional junction substance 161 may be applied to entirely surround the coating area of the auto-agglutination solder 140.

Furthermore, the provisional junction substance 161 may have a linear shape continuously formed in a direction along the display surface 110f of the display panel 110 or may have a dot shape intermittently formed in the direction along the display surface 110f of the display panel 110. The provisional junction substance 161 finally forms the resin junction part 160. Therefore, the provisional junction substance 161 is the same material as the resin junction part 160.

The provisional junction substance 161 may be provided ahead at the time of manufacturing the display panel 110 before application of the auto-agglutination solder 140 or may be provided before or after application of the auto-agglutination solder 140 for electrically joining the electronic component 130 to the display panel 110. Alternatively, the provisional junction substance 161 already formed in a predetermined shape may be attached to the vertical end surface 110s of the display panel 110.

The connection pad 200 at the vertical end surface 110s of the display panel 110 and the connection electrode 133 on the line substrate 131 of the electronic component 130 are aligned with a predetermined precision after application of the auto-agglutination solder 140 and the provisional junction part 160.

The provisional junction substance 161 is heated to a temperature lower than the melting point of the solder particle 140b and the melting point of the provisional junction substance 161 by using the thermo-compressing device used in the junction process using the anisotropic conductive film (ACF). Then, the auto-agglutination solder 140 is not melted and the provisional junction substance 161 is softened.

Thereafter, heating the provisional junction substance 161 is stopped. If the temperature of the provisional junction substance 161 decreases, the provisional junction substance 161 is cured, and the electronic component 130 is provisionally junctioned to the vertical end surface 110s of the display panel 110 in a state in which the connection pad 200 provided on the vertical end surface 110s of the display panel 110 and the connection electrode 133 formed on the line substrate 131 of the electronic component 130 are aligned.

Next, the vertical end surface 110s of the display panel 110 and the electronic component 130 are pressed towards a direction approaching each other and heated using the thermo-compressing device used in the junction process using the anisotropic conductive film (ACF). A predetermined pressure and a predetermined temperature are applied to the auto-agglutination solder 140 during a predetermined time (period). For example, the predetermined pressure may be applied to the auto-agglutination solder 140 under the temperature of 150° C. for 15 minutes.

As shown in FIG. 6, the thermosetting resin 140a and the solder particle 140b are melted by the applied heat, and the solder particles 140b in the thermosetting resin 140a which have fluidity are aggregated to each other and become closer to the connection pad 200 and the connection electrode 133. As a result, as shown in FIG. 7, the solder particle 140b is auto-agglutinated and metallically bonded at a space between the connection pad 200 and the connection electrode 133, which are formed of a metallic material. Namely, the connection pad 200 of the display panel 110 and the connection electrode 133 of the electronic component 130 are soldered by a solder metal (a solder junction part) "H" formed of a plurality of auto-agglutinated solder particles 140b. Additionally, the melted thermosetting resin 140a is aggregated in a space between adjacent connection pads 200 and/or between adjacent connection electrodes 133, such that the line substrate 131 of the electronic component 130 and the vertical end surface 110s of the display panel 110 are attached to each other by an insulating resin (a resin adhesion part) "P" formed of the thermosetting resin 140a.

The auto-agglutination solder 140 is cooled after the thermo-compressing process such that the junction of the electronic component 130 to the vertical end surface 110s of the display panel 110 is completed.

In addition, while the auto-agglutination solder 140 is heated and pressed in the thermo-compressing process, the provisional junction substance 161 is melted by being heated above the melting point and then is cured by cooling. At this time, the provisional junction substance 161 heated above the melting point is thermally hardened, thereby maintaining the junction condition between the electronic component 130 and the vertical end surface 110s of the display panel 110.

Accordingly, the connection pad 200 at the vertical end surface 110s of the display panel 110 and the connection electrode 133 on the line substrate 131 of the electronic component 130 are metallically bonded by the solder metal H of the auto-agglutination solder 140 such that the connection pad 200 and the connection electrode 133 are electrically connected. In addition, the vertical end surface 110s of the display panel 110 and the line substrate 131 of the electronic component 130 are mechanically attached (or bonded) by the metal bond by the solder metal H and the adhesion by the insulating resin P.

The mechanical junction between the vertical end surface 110s of the display panel 110 and the line substrate 131 of the electronic component 130 by the solder metal H and the insulating resin P may have a tensile strength being equal to or greater than about 500 g/cm.

Moreover, the line substrate 131 of the electronic component 130 and the vertical end surface 110s of the display panel 110 are also mechanically junctioned by the resin junction part 160 formed of the cured provisional junction substance 161.

For example, the solder metal H between the connection pad 200 and the connection electrode 133 may have a thickness being equal to or less than about 20 μm.

A pitch of the connection pad 200 (i.e., a distance between adjacent connection pads) and a pitch of the connection electrode 133 (i.e., a distance between adjacent connection electrodes) each may be about 10 to 100 μm.

As shown in FIGS. 1 and 2, a bezel 150, which forms an outer case of the display device 100A, is installed at a periphery of the display panel 110 where the electronic component 130 is installed. For example, the bezel 150 may include a side plate part 150a at an outer side of the vertical end surface 110s of the display panel 110 and a front plate part 150b extending from the side plate part 150a toward a center of the display panel 110 and covering a front edge of the display surface 110f of the display panel 110. The electronic component 130 is accommodated in a space between the side plate part 150a of the bezel 150 and the vertical end surface 110s of the display panel 110.

As mentioned above, the vertical end surface 110s of the display panel 110 and the line substrate 131 of the electronic component 130 such that a width "w" of the bezel can be reduced. Namely, a narrow bezel display device 100A is provided.

In addition, as shown in FIG. 8, a plurality of display devices 100A of the narrow bezel are arranged to form a display system 1. In the display system 1, the plurality of display devices 100A are adjacently arranged along a vertical direction and a horizontal direction. In the display system 1, an image is displayed at a display region "A" formed by the plurality of display devices 100A.

Since the display system 1 includes the narrow bezel display devices 100A, a gap between adjacent display devices 100A is reduced such that a high quality image is provided at the display region "A."

An installation method of the electronic component 130 of the present disclosure includes disposing the provisional junction substance 161 formed of a material having the melting point lower than the solder particle 140b of the auto-agglutination solder 140 between the vertical end surface 110s of the display panel 110 and the electronic component 130, while disposing the connection electrode 133 of the electronic component 130 to face the vertical end surface 110s of the display panel 110 including the connection pad 200 at the end 113e of the line part 113 between the first substrate 111 and the second substrate 112. The installation method further includes interposing (or coating) the auto-agglutination solder 140, which includes the thermosetting resin 140a and the solder particle 140b, between the connection electrode 133 and the connection pad 200. The installation method also includes provisionally junctioning the electronic component 130 and the vertical end surface 110s of the display panel 110 by softening the provisional junction substance 161 at the temperature lower than the melting point of the solder particle 140b and lower than the melting point of the provisional junction substance 161. Additionally, the installation method includes pressurizing and junctioning the connection electrode 133 to the connection pad 200 in a direction approaching each other by heating-up the auto-agglutination solder 140 and the provisional junction substance 161.

According to the installation method of the electronic component 130 of the present disclosure, since the electronic component 130 and the vertical end surface 110s of the display panel 110 are provisionally junctioned before soldering with the auto-agglutination solder 140, the connection electrode 133 of the electronic component 130 and the connection pad 200 can be aligned with a high precision.

The junction process for the electronic component 130 and the display panel 110 can be efficiently carried out by soldering with the auto-agglutination solder 140, after provisionally junctioning the electronic component 130 and the display panel 110 with the provisional junction substance 161.

In addition, after performing the provisional junction process with the provisional junction substance 161, the connection electrode 133 of the electronic component 130 and the connection pad 200 may be aligned again by heating again and softening the provisional junction substance 161 if it is before junctioning with the auto-agglutination solder 140.

Moreover, the solder metal H, which is created by the aggregation of the solder particles 140b, is formed between the connection electrode 133 and the connection pad 200. In comparison to use of ACF, the amount of the conductive particles between the connection electrode 133 and the connection pad 200 is increased such that the increase of the contact (or connection) resistance between the connection electrode 133 and the connection pad 200 is prevented.

Furthermore, the vertical end surface 110s of the display panel 110 and the electronic component 130 are mechanically attached (or bonded) by the metal bond of the solder metal H of the solder particle 140b and by the adhesion of the insulating resin P of the thermosetting resin 140b. Additionally, the electronic component 130 and the vertical end surface 110s of the display panel 110 are also junctioned around the auto-agglutination solder 140 by the resin junction part 160 (the provisional junction substance 161). Therefore, the electronic component 130 is securely junctioned.

Moreover, in the junction structure of the electronic component 130, the display panel 110, the display device 100A, and the display system 1, there is an junction part "J" that electrically joins the connection pad 200 at the vertical end surface 110s of the display panel 110 (which includes the first substrate 111, the second substrate 112 and the connection pad 200 at the end 113e of the line part 113 between the first and second substrates 111 and 112) with the electronic component 130 (which includes the connection electrode 133 facing the vertical end surface 110s of the display panel 110). The junction part "J" includes the solder metal "H" between the connection pad 200 and the connection electrode 133, the insulating resin "P" attaching (adhering) the vertical end surface 110s and the electronic component 130 in a region outside the solder metal "H," and the resin junction part 160 formed of a material having a lower melting point than the solder metal "H" between the vertical end surface 110s of the display panel 110 and the electronic component 130.

In the present disclosure, the electronic component 130 is securely combined (junctioned or connected) to the vertical end surface 110s of the display panel 110, and the electric connection property is increased such that the increase of the connection resistance (contact resistance) is prevented.

Second Embodiment

Figure 10:
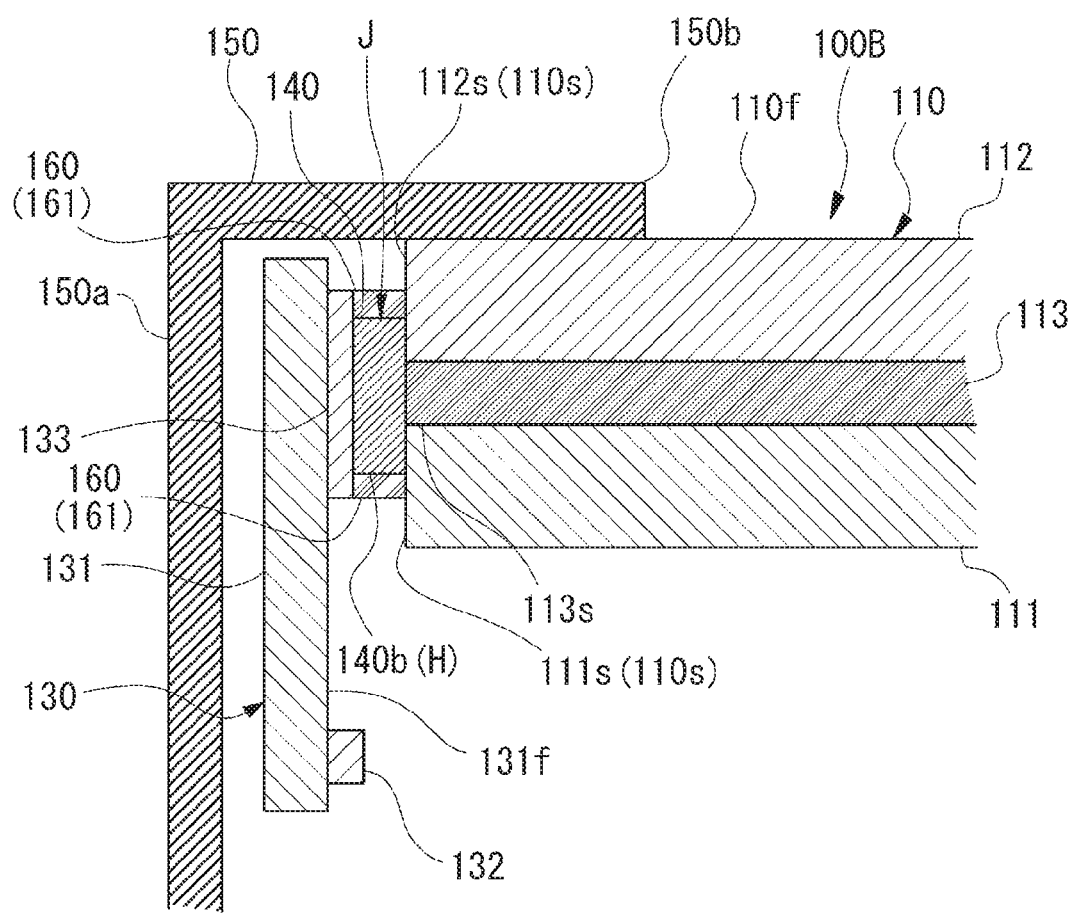
FIG. 10 is a schematic cross-sectional view of a portion of a display device according to a second embodiment of the present disclosure.
Figure 11:
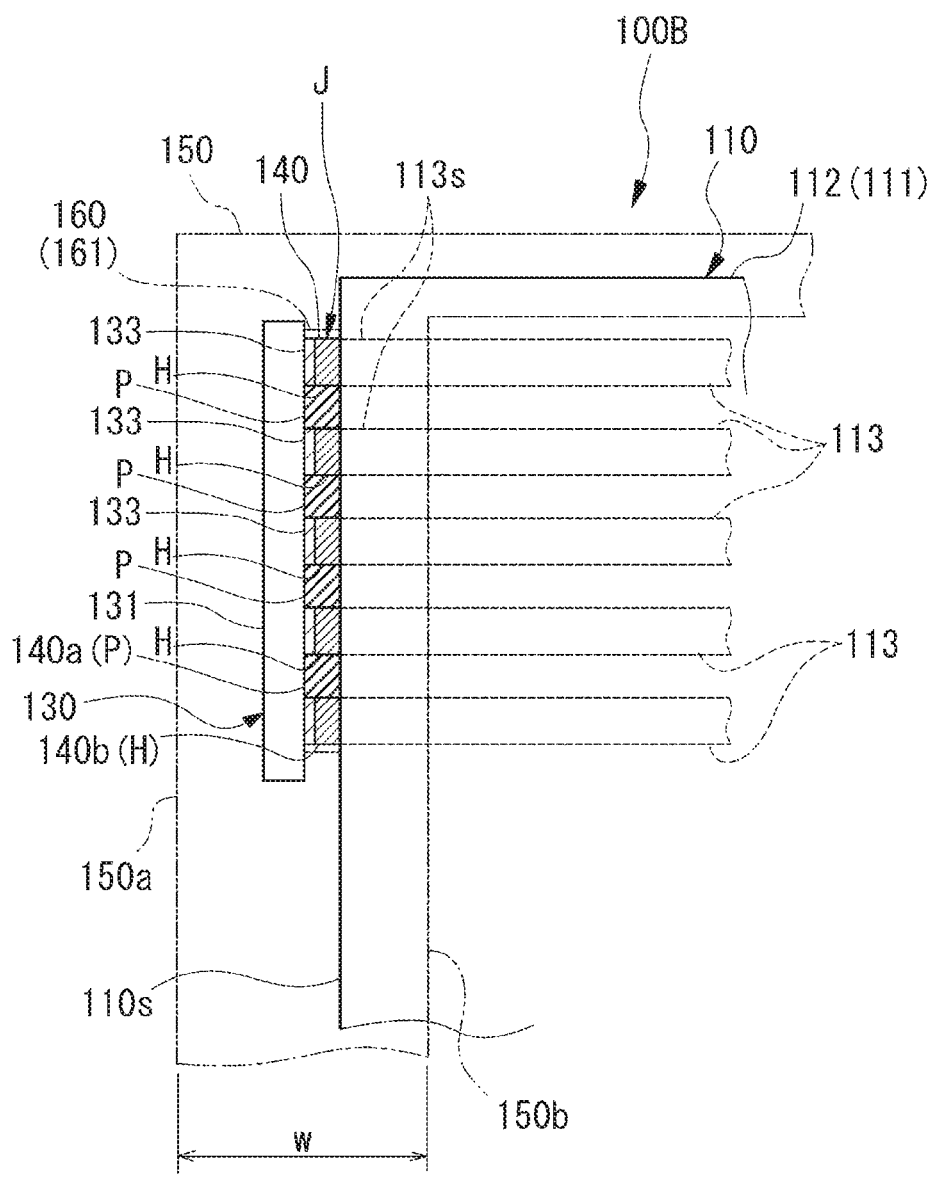
FIG. 11 is a schematic plane view of a portion of the display device of FIG. 10.
Figure 12:
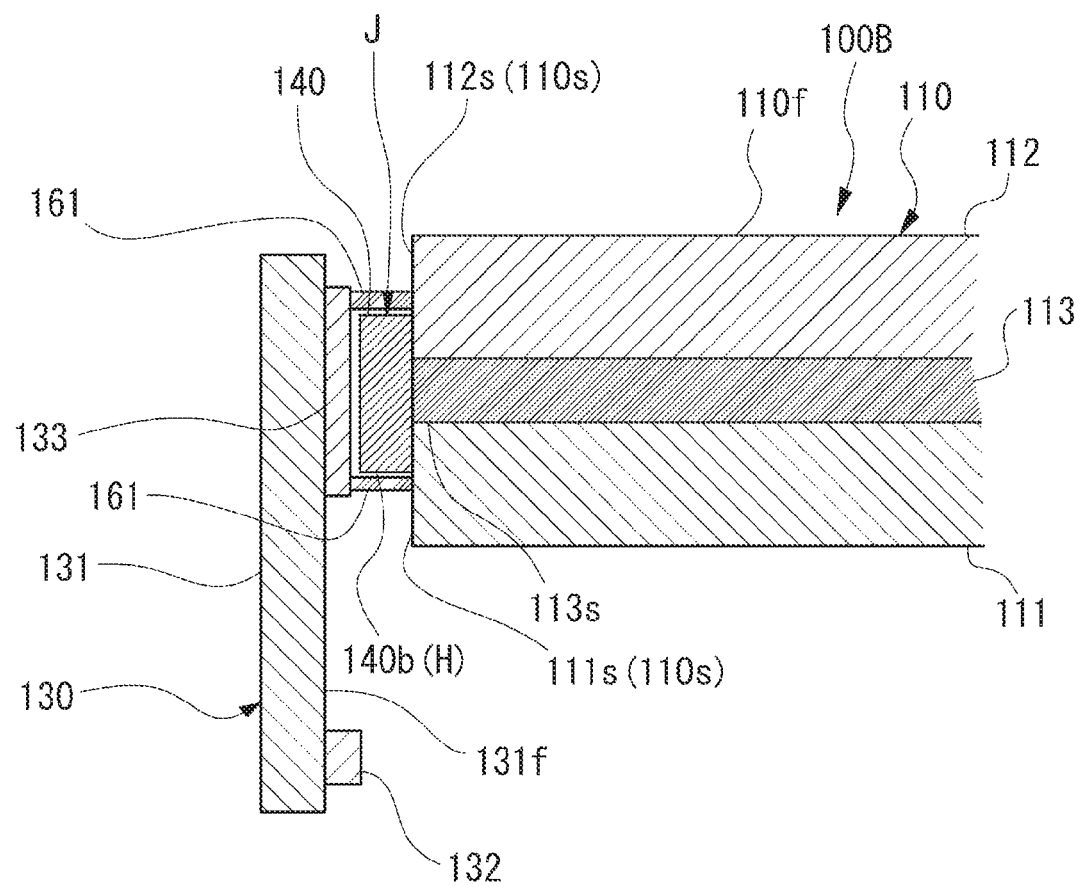
FIG. 12 is a schematic cross-sectional view of a display panel and an electronic component provisionally junctioned by a provisional junction substance.

FIG. 10 is a schematic cross-sectional view of a portion of a display device according to a second embodiment of the present disclosure. FIG. 11 is a schematic plane view of a portion of the display device. FIG. 12 is a schematic cross-sectional view of a display panel and an electronic component provisionally junctioned by a provisional junction substance. The same reference numbers are used to the same elements as the first embodiment, and the explanation for those may be omitted.

Referring to FIGS. 10 and 11, a display device 100B includes a display panel (e.g., a liquid crystal panel) 110, a light source (not shown) that emits light toward the display panel 110, and a light guiding part (not shown) that guides the light from the light source toward a rear side of the display panel 110. The display panel 110 may be referred to as a substrate stack or a substrate device.

The display panel 110 as the liquid crystal panel includes a first substrate (a substrate) 111, a second substrate (a substrate) 112 facing the first substrate 111 and a liquid crystal layer (not shown) between the first and second substrates 111 and 112.

Each of the first and second substrates 111 and 112 may be one of a glass substrate, a resin substrate and a print substrate.

Although not shown in the figures, on at least one of the first and second substrates 111 and 112 (e.g., the first substrate 111), a line part (a line) 113, which includes a signal line including a data line and a gate line, a thin film transistor, and so on, are formed. The liquid crystal layer is driven by the line part 113 such that the display device 100A provides an image. The line part 113 may have a single-layered structure formed of a low resistance conductive material, e.g., aluminum (Al) or copper (Cu). Alternatively, the line part 113 may have a multi-layered structure including a first layer formed of a lower resistance conductive material, e.g., Al or Cu and a second layer formed of a conductive material, e.g., chrome (Cr), molybdenum (Mo) or titanium (Ti).

An end part 113s of each line part 113 is a drawout part of the line part 113 and has a single-layered structure formed of a conductive material that is capable of forming the electrical junction with the solder. The conductive material for the end part 113s of the line part 113 may be one of tin (Sn), lead (Pb), zinc (Zn), silver (Ag) and copper (Cu). Alternatively, the end part 113s of the line part 113 may have a multi-layered structure including a first layer of the above conductive material and a second layer formed of Cr, Mo or Ti.

In the display panel 110, the end surface 111s of the first substrate 111 and the end surface 112s of the second substrate 112 are disposed on the same plane. At the end of the display panel 110, a vertical end surface 110s, which is perpendicular to a display surface 110f, is formed (or defined) by the end surface 111s of the first substrate 111 and the end surface 112s of the second substrate 112.

At the vertical end surface 110s of the display panel 110, the end part 113s of the line part 113 (a substrate side line connection part) is disposed on the same plane with the end surface 111s of the first substrate 111 and the end surface 112s of the second substrate 112 such that the end part 113s of the line part 113 is exposed.

At the vertical end surface 110s of the display panel 110, the electronic component 130 is installed. The electronic component 130 may include a line substrate (a film substrate) 131 as a film type and a chip component 132, e.g., a large scale integration (LSI), installed (or arranged) on a surface 131f of the line substrate 131. For example, the electronic component 130 may be a chip on film (COF). On the surface 131f of the line substrate 131, a plurality of connection electrodes (an electronic component side line connection part) 133, which are respectively junctioned with the line parts 113 of the display panel 110, are formed. The connection electrode 133 may be formed of a conductive material, e.g., Sn, Pb, Zn, Ag or Cu, that is capable of junctioning with the solder. A vertical length (length) of the connection electrode 133 along a direction from the first substrate 111 to the second substrate 112 (or the second substrate 112 to the first substrate 111) is larger than that of the substrate side line connection part 113s (i.e., the end of the line part 113).

The electronic component 130 is solder-junctioned to the end part (i.e., the substrate side line connection part) 113s of the line part 113, which is exposed at the vertical end surface 110s of the display panel 110, by an auto-agglutination solder 140. As shown in FIG. 5, the auto-agglutination solder 140 is a paste material. In the auto-agglutination solder 140, a solder particle 140b formed of a solder-alloy material, e.g., Cu or Sn, is uniformly dispersed in a thermosetting resin 140a. The thermosetting resin 140a is formed of a material having a melting point lower than the solder particle 140b. As the material for forming the thermosetting resin 140a, for example, an epoxy resin, a urethane resin, an acrylic resin, a silicone resin, a phenol resin, a melamine resin, an alkyd resin, an urea resin, an unsaturated polyester resin, or the like, which has a melting point of 90° C. to 150° C., may be used. Here, the material for forming the thermosetting resin 140a exhibits fluidity at a temperature of the melting point or more.

For example, 'Reflow Self Assembly Anisotropic Conductive Paste Epowell AP series' (SEKISUI CHEMICAL CO., LTD.) or 'Low-Temperature-Curable conductive' (Hitachi Chemical Co., Ltd.) may be used as the auto-agglutination solder 140.

In addition, at each of an upper side and a lower side of the auto-agglutination solder 140 junctioning the vertical end surface 110s of the display panel 110 and the electronic component 130, a resin junction part 160 is formed of a resin material having a melting point lower than the auto-agglutination solder 140. The resin junction part 160 may be formed of, for example, an epoxy resin, a urethane resin, an acrylic resin, a silicone resin, a phenol resin, a melamine resin, an alkyd resin, an urea resin, an unsaturated polyester resin, or the like, which has a melting point of 90° C. to 150° C. Moreover, the resin material for the resin junction part 160 is thermally cured when it is heated again above the melting point in order to create a solder-junction using the auto-agglutination solder 140 after provisionally junctioning the electronic component 130 to the vertical end surface 110s of the display panel 110. This maintains the junction condition between the electronic component 130 and the vertical end surface 110s of the display panel 110.

The junction of the electronic component 130 to the end part 113s at the vertical end surface 110s of the display panel 110 is made using the auto-agglutination solder 140. In some embodiments, the auto-agglutination solder 140 is coated on the vertical end surface 110s of the display panel 110. For example, the auto-agglutination solder 140 of the paste phase may be coated by a screen printing process, a mesh-mask printing process, or an ink-jet process.

In addition, as shown in FIG. 12, at the vertical end surface 110s of the display panel 110, a provisional junction substance 161 is coated on each of upper and lower sides of a coating area of the auto-agglutination solder 140. In some embodiments, the provisional junction substance 161 has a thickness larger than a coating thickness of the auto-agglutination solder 140 in a direction facing the vertical end surface 110s of the display panel 110 and the electronic component 130. In this manner, the provisional junction substance 161 provided at the vertical end surface 110s of the display panel 110 surely contacts the electronic component 130 during the provisional junctioning to be described later.

Moreover, since the provisional junction substance 161 spreads upward and downward as compared with a coating area when the auto-agglutination solder 140 is thermally bonded, the provisional junction substance 161, beneficially, is provided on a certain position that provisional junction substance 161 does not interfere with the auto-agglutination solder 140 considering the spread.

Alternatively, the provisional junction substance 161 may be provided on only one of the upper and lower sides of the coating area of the auto-agglutination solder 140. That is, the provisional junction substance 161 may be provided on only one of the end surface 111s of the first substrate 111 and the end surface 112s of the second substrate 112. In addition, the provisional junction substance 161 may be applied to entirely surround the coating area of the auto-agglutination solder 140.

Furthermore, the provisional junction substance 161 may have a linear shape continuously formed in a direction along the display surface 110f of the display panel 110 or may have a dot shape intermittently formed in the direction along the display surface 110f of the display panel 110.

The provisional junction substance 161 finally forms the resin junction part 160. Therefore, the provisional junction substance 161 is the same material as the resin junction part 160. The provisional junction substance 161 may be provided ahead at the time of manufacturing the display panel 110 before application of the auto-agglutination solder 140 or may be provided before or after application of the auto-agglutination solder 140 for electrically joining the electronic component 130 to the display panel 110. Alternatively, the provisional junction substance 161 already formed in a predetermined shape may be attached to the vertical end surface 110s of the display panel 110.

The end part 113s of the line part 113 exposed at the vertical end surface 110s of the display panel 110 and the connection electrode 133 on the line substrate 131 of the electronic component 130 are aligned with a predetermined precision after application of the auto-agglutination solder 140 and the provisional junction part 160.

The provisional junction substance 161 is heated to a temperature lower than the melting point of the solder particle 140b and the melting point of the provisional junction substance 161 by using the thermo-compressing device used in the junction process using anisotropic conductive film (ACF). Then, the auto-agglutination solder 140 is not melted and the provisional junction substance 161 is softened.

Thereafter, heating the provisional junction substance 161 is stopped. If the temperature of the provisional junction substance 161 decreases, the provisional junction substance 161 is cured, and the electronic component 130 is provisionally junctioned to the vertical end surface 110s of the display panel 110 in a state in which the end part 113s of the line part 113 exposed at the vertical end surface 110s of the display panel 110 and the connection electrode 133 formed on the line substrate 131 of the electronic component 130 are aligned.

Next, the vertical end surface 110s of the display panel 110 and the electronic component 130 are pressed in a direction approaching each other and heated using the thermo-compressing device used in the junction process using the anisotropic conductive film (ACF). A predetermined pressure and a predetermined temperature are applied to the auto-agglutination solder 140 during a predetermined period of time). For example, the predetermined pressure may be applied to the end part 113s of the line part 113 exposed at the vertical end surface 110s of the display panel 110 and the connection electrode 133 on the line substrate 131 of the electronic component 130 under the temperature of 150° C. for 15 minutes.

As shown in FIGS. 6 and 7, the thermosetting resin 140a and the solder particle 140b are melted by the applied heat, and the solder particles 140b in the thermosetting resin 140a which have fluidity are aggregated to each other and metallically bonded at a space between the end part 113s of the line part 113 and the connection electrode 133, which are formed of a metallic material. Namely, the end part 113s of the line part 113 of the display panel 110 and the connection electrode 133 of the electronic component 130 are soldered by a solder metal (a solder junction part) "H" formed of a plurality of auto-agglutinated solder particles 140b. Additionally, between the vertical end surface 110s of the display panel 110 and the line substrate 131 of the electronic component 130, the melted thermosetting resin 140a is aggregated such that an insulating resin (a resin adhesion part) "P" is formed of the thermosetting resin 140a in an area other than a portion where the solder metal H is formed.

The auto-agglutination solder 140 is cooled after the thermo-compressing process such that the junction of the electronic component 130 to the vertical end surface 110s of the display panel 110 is completed.

In addition, while the auto-agglutination solder 140 is heated and pressed in the thermo-compressing process, the provisional junction substance 161 is melted by being heated above the melting point and then is cured by cooling. At this time, the provisional junction substance 161 heated above the melting point is thermally hardened, thereby maintaining the junction condition between the electronic component 130 and the vertical end surface 110s of the display panel 110.

Accordingly, as shown in FIGS. 10 and 11, the end part 113s of the line part 113, which is exposed at the vertical end surface 110s of the display panel 110 and the connection electrode 133 on the line substrate 131 of the electronic component 130 are selectively metallically bonded by the solder metal H of the auto-agglutination solder 140 to be electrically connected.

In addition, the vertical end surface 110s of the display panel 110 and the line substrate 131 of the electronic component 130 are mechanically attached (or bonded) by the metal bond using the solder metal H and the adhesion using the insulating resin P.

The mechanical junction between the vertical end surface 110s of the display panel 110 and the line substrate 131 of the electronic component by the solder metal H and the insulating resin P may have a tensile strength being equal to or greater than about 500 g/cm.

Moreover, the line substrate 131 of the electronic component 130 and the vertical end surface 110s of the display panel 110 are also mechanically junctioned by the resin junction part 160 formed of the cured provisional junction substance 161.

For example, the solder metal H between the end part 113s and the connection electrode 133 may have a thickness being equal to or less than about 20 μm.

A pitch of the end part 113s and a pitch of the connection electrode 133 each may be about 10 to 100 μm.

A bezel 150, which forms an outer case of the display device 100B, is installed at a periphery of the display panel 110 where the electronic component 130 is installed. For example, the bezel 150 may include a side plate part 150a at an outer side of the vertical end surface 110s of the display panel 110 and a front plate part 150b extending from the side plate part 150a toward a center of the display panel 110 and covering a front edge of the display surface 110f of the display panel 110. The electronic component 130 is accommodated in a space between the side plate part 150a of the bezel 150 and the vertical end surface 110s of the display panel 110.

As mentioned above, the vertical end surface 110s of the display panel 110 and the line substrate 131 of the electronic component 130 such that a width "w" of the bezel can be reduced. Namely, a narrow bezel display device 100B is provided.

In addition, a plurality of display devices 100B of the narrow bezel are arranged to form a display system 1 as shown in FIG. 8. In the display system 1, the plurality of display devices 100B are adjacently arranged along a vertical direction and a horizontal direction. In the display system 1, an image is displayed at a display region "A" formed by the plurality of display devices 100B.

Since the display system 1 includes the narrow bezel display devices 100B, a gap between adjacent display devices 100B is reduced such that a high quality image is provided at the display region "A."

An installation method of the electronic component 130 of the present disclosure includes disposing the provisional junction substance 161 formed of a material having the melting point lower than the solder particle 140b of the auto-agglutination solder 140 between the vertical end surface 110s of the display panel 110 and the electronic component 130, while disposing the connection electrode 133 of the electronic component 130 to face the vertical end surface 110s of the display panel 110 including the line part 113 installed between the first substrate 111 and the second substrate 112. The installation method further includes interposing (or coating) the auto-agglutination solder 140, which includes the thermosetting resin 140a and the solder particle 140b, between the connection electrode 133 and the end part 113s of the line part. The installation method also includes provisionally junctioning the electronic component 130 and the vertical end surface 110s of the display panel 110 by softening the provisional junction substance 161 at the temperature lower than the melting point of the solder particle 140b and lower than the melting point of the provisional junction substance 161. Additionally, the installation method includes pressurizing and junctioning the connection electrode 133 to the end part 113s in a direction approaching each other by heating-up the auto-agglutination solder 140 and the provisional junction substance 161.

According to the installation method of the electronic component 130 of the present disclosure, since the electronic component 130 and the vertical end surface 110s of the display panel 110 are provisionally junctioned before soldering with the auto-agglutination solder 140, the connection electrode 133 of the electronic component 130 and the end part 113s of the line part 113 can be aligned with a high precision.

The junction process for the electronic component 130 and the display panel 110 can be efficiently carried out by soldering with the auto-agglutination solder 140, after provisionally junctioning the electronic component 130 and the display panel 110 with the provisional junction substance 161.

In addition, after performing the provisional junction process with the provisional junction substance 161, the connection electrode 133 of the electronic component 130 and the end part 113s of the line part 113 may be aligned again by heating again and softening the provisional junction substance 161 if it is before junctioning with the auto-agglutination solder 140.

Moreover, the solder metal H, which is created by the aggregation of the solder particles 140b, is formed between the connection electrode 133 and the end part 113s of the line part 113. In comparison to use of ACF, the amount of the conductive particles between the connection electrode 133 and the end part 113s of the line part 113 is increased such that the increase of the contact (or connection) resistance between the connection electrode 133 and the end part 113s of the line part 113 is prevented.

Furthermore, the vertical end surface 110s of the display panel 110 and the electronic component 130 are mechanically attached (or bonded) by the metal bond of the solder metal H of the solder particle 140b and by the adhesion of the insulating resin P of the thermosetting resin 140b. Additionally, the electronic component 130 and the vertical end surface 110s of the display panel 110 are also junctioned around the auto-agglutination solder 140 by the resin junction part 160 (the provisional junction substance 161). Therefore, the electronic component 130 is securely junctioned.

Moreover, since the end part 113s of the line part 113, which is exposed at a space between the first and second substrates 111 and 112, is defined as the substrate side line connection part, the connection part 200 is not required as compared with the first embodiment. Accordingly, the process of forming the connection pad 200 is omitted such that the production efficiency is increased and the production cost is decreased.

Further, in the junction structure of the electronic component 130, the display panel 110, the display device 100B and the display system 1, there is an junction part "J" that electrically joins the end part 113s of the line part 113 at the vertical end surface 110s of the display panel 110 (which includes the first substrate 111, the second substrate 112 and the line part 113 between the first and second substrates 111 and 112) with the electronic component 130 (which includes the connection electrode 133 facing the vertical end surface 110s of the display panel 110). The junction part "J" includes the solder metal "H" between the end part 113s of the line part 113 and the connection electrode 133, the insulating resin "P" attaching (adhering) the vertical end surface 110s and the electronic component 130 in a region outside the solder metal "H," and the resin junction part 160 formed of a material having a lower melting point than the solder metal "H" between the vertical end surface 110s of the display panel 110 and the electronic component 130.

In the present disclosure, the electronic component 130 is securely combined (junctioned or connected) to the vertical end surface 110s of the display panel 110, and the electric connection property is increased such that the increase of the connection resistance (contact resistance) is prevented.

Other Embodiments

The present disclosure is not limited to the embodiments described above with reference to the drawings, but various modifications may be made in the technical scope thereof.

For example, in each of the above embodiments, the provisional junction substance 161 may be provided on the vertical end surface 110s of the liquid crystal panel 110. However, the provisional junction substance 161 may be provided on the electronic component 130 or may be provided on both the vertical end surface 110s of the display panel 110 and the electronic component 130.

Moreover, the installing method of the electronic component 130 and the bonding structure of the electronic component 130 shown in each of the above embodiments can be applied to various electronic devices in addition to the display devices 100A and 100B.

Furthermore, the display devices 100A and 100B are not limited to the liquid crystal display device, and the present disclosure can be similarly applied to an organic light emitting diode display device, a plasma display panel display device, and the like.

It will be apparent to those skilled in the art that various modifications and variations can be made in a display device of the present disclosure without departing from the sprit or scope of the embodiments. Thus, it is intended that the present disclosure covers the modifications and variations of this disclosure provided they come within the scope of the appended claims and their equivalents.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of installing an electronic component, comprising:
    positioning the electronic component including an electronic component side line connection part at a vertical end surface of a substrate stack that includes two substrates, a line between the two substrates, and a substrate side line connection part at an end of the line, the electronic component side line connection part facing the vertical end surface;

forming an auto-agglutination solder between the electronic component side line connection part and the substrate side line connection part, the auto-agglutination solder including a thermosetting resin and one or more solder particles;

forming a provisional junction substance between the vertical end surface of the substrate stack and the electronic component, the provisional junction substance formed of a material having a melting point lower than the one or more solder particles;

provisionally junctioning the electronic component and the vertical end surface of the substrate stack by softening the provisional junction substance at a temperature lower than a melting point of the solder particle and the melting point of the provisional junction substance; and heating-up the auto-agglutination solder and the provisional junction substance.

2. The method according to claim 1, wherein provisional junction substance is positioned around the auto-agglutination solder, which is interposed between the electronic component side line connection part and the substrate side line connection part, between the vertical end side of the substrate stack and the electronic component.

3. The method according to claim 1, wherein provisional junction substance is provided on at least one of the vertical end surface of the substrate stack and the electronic component.

4. The method according to claim 1, wherein provisional junction substance is provided on the two substrates at the vertical end surface of the substrate stack.

5. The method according to claim 1, wherein provisional junction substance is formed of a resin material having a melting point lower than the solder particle.

6. The method according to claim 1, wherein the substrate side line connection part is connected to the end of the line and formed along the vertical end surface, and the substrate side line connection part is a connection pad formed of a conductive material.

7. The method according to claim 1, wherein the substrate side line connection part is a portion of the end of the line that is exposed in a space between the two substrates.

8. The method according to claim 1, wherein the auto-agglutination solder is a paste that is coated on the substrate side line connection part.

9. The method according to claim 8, wherein the auto-agglutination solder is coated by one of a screen printing process, a mesh-mask printing process, and an ink-jet process.

10. The method according to claim 1, wherein the electronic component includes a film substrate including the electronic component side line connection part and a chip component on the film substrate.

11. The method according to claim 1, wherein the line having the substrate side line connection part is formed on at least one of the two substrates.

12. The method according to claim 1, wherein each of the two substrates is a glass substrate, a resin substrate, or a print substrate.

13. The method according to claim 1, wherein the substrate stack and the electronic component junctioned at the vertical end surface of the substrate stack form at least one of a liquid crystal display device, an organic light emitting diode display device, and a plasma display panel display device.

14. The method according to claim 1, wherein the step of heating-up the auto-agglutination solder and the provisional junction substance further includes:

pressurizing the electronic component side line connection part and the substrate side line connection part.

* * * * *